United States Patent [19]

Swamy et al.

[11] Patent Number: 5,567,295
[45] Date of Patent: Oct. 22, 1996

[54] METHOD AND APPARATUS FOR MAKING STAGGERED BLADE EDGE CONNECTORS

[75] Inventors: Deepak N. Swamy; Victor K. Pecone, both of Austin, Tex.

[73] Assignee: Dell USA L.P., Austin, Tex.

[21] Appl. No.: 180,175

[22] Filed: Jan. 11, 1994

[51] Int. Cl.$^6$ .................................................. C25D 5/02
[52] U.S. Cl. ............................... 205/125; 205/128
[58] Field of Search .................................. 205/122, 125, 205/126, 128

[56] References Cited

U.S. PATENT DOCUMENTS

| | | | |
|---|---|---|---|
| 3,825,999 | 7/1974 | Rubey | 29/837 |
| 4,000,045 | 12/1976 | Rotzow | 205/125 |

*Primary Examiner*—Kathryn Gorgos
*Assistant Examiner*—William T. Leader

[57] ABSTRACT

An inexpensive method for fabricating a staggered edge connector for a circuit board. The method is cost effective and includes numerous advantages over the prior art, including allowing more area for signal routing and removing the problems associated with capacitive stubs on edge connector traces associated with prior art designs. The method begins with creating a staggered plurality of blades or fingers. A plating bus is formed on these staggered blades by connecting a gold plating bus to one of the contact pads and then shorting together or connecting the signal lines via a shorting bus. The shorting bus is placed flush with the innermost edge of the edge connector well outside of the actual wipe area of the connectors. The board then undergoes a standard semi-additive process, as well as a final etch and subsequent gold plating. The shorting bar is then drilled out. Due to the placement of the shorting bar flush with the innermost edge of the edge connectors, the resultant vias do not occupy valuable signal routing area. Further, the drilling operation does not produce any capacitive stubs, thereby alleviating any cosmetic or performance problems associated with capacitive stubs, while not adding any additional time or cost to the board.

11 Claims, 2 Drawing Sheets

METHOD AND APPARATUS FOR MAKING STAGGERED BLADE EDGE CONNECTORS

FIELD OF THE INVENTION

The present invention relates generally to electronic circuit board connectors and, more specifically, to a method for fabricating a staggered blade edge connector for a printed circuit board.

DESCRIPTION OF THE RELATED ART

In modern electronic devices such as computer systems it is common to configure the device for a particular purpose by inserting modular electronic circuit boards into respective sockets which are connected to other electronic components on the device. For example, personal computer systems can be configured for a particular application by connecting modular circuit boards to the computer's expansion bus. Common examples of modular circuit boards include network interface cards, modems, video cards, sound cards, etc.

A typical modular electronic circuit board comprises an edge connector having a plurality of electronic contact pads or blades which make contact with complimentary electronic "wiping" contacts in the mating socket. The electrical connections which must be established between the host system and the expansion board include electrical data signals, as well as power and ground signals. Although it is recommended practice to disconnect power to an electronic device prior to connecting or removing a circuit board, very commonly a user will inadvertently fail to disconnect power prior to removing or inserting the circuit board. In such situations, it is possible for shorts to occur between data and/or power signals, thus resulting in damage to either the host electronic device or the expansion circuit board. To avoid such problems circuit board manufacturers often use staggered blades on expansion circuit boards to ensure that the ground connection is the first mechanical and electrical contact when the circuit board is inserted into the socket and the last to be disconnected when the board is removed from the system.

Referring now to FIG. 1, a portion of a circuit board 10 illustrating an example of a staggered blade edge connector is shown. As shown, the staggered blade edge connector includes blades or fingers (also referred to as contact pads) which includes a first group of blades 12a of a first length and a second group of blades 12b having a second length. The rectangular blades 12a and 12b shown in FIG. 1 are connected to a plurality of circuit traces 13 which establish electrical connections between the blades and the electronic components on the circuit board. The contact blades 12a extend to the edge 14 of the board 10, while the blades 12b are recessed slightly away from the edge 14. Since the blades 12a are longer than the blades 12b, the blades 12a electrically connect to the mating socket prior to the blades 12b as shown by line 14. Thus, when the circuit board 10 is inserted into a socket (not shown) having complementary electrical wiping contacts, the blades 12a will establish electrical contact prior to blades 12b. Furthermore, when the circuit board 10 is removed from the socket, the blades 12a will maintain electrical connection until after the blades 12b have been disconnected from the socket. Contact blades 12a, such as those illustrated in FIG. 1, are often used to establish and maintain a ground connection between the circuit board 10 and the host electronic device to protect sensitive electronic components. Therefore, the blades 12a are preferably used for ground connections, whereas the blades 12b are preferably used for data and power signals.

A number of prior art methods exist for fabricating a staggered blade edge connector on a printed circuit board as shown in FIG. 1. Three commonly used methods include: 1) selective plating of deep gold; 2) edge plating followed by selective scoring; and 3) edge plating using a staggered bus followed by plating.

In the first method, referred to as selective plating of deep gold, the entire circuit board is remasked after plating the original copper pattern, and the staggered edge is selectively plated with electrolytic gold. The photoresist is then stripped away and a fresh coat of resist is applied, followed by reimaging for tin/lead plating. The reimaging step includes outer layer finishing by stripping the resist, etching the base copper and solder stripping. Although this process results in a high quality circuit board connector, it is the least desirable process due to the high cost associated with the numerous process steps outlined above.

FIGS. 2A–B illustrate a second prior art method for fabricating a staggered blade edge connector using a process referred to as edge plating followed by selective scoring. In this method a circuit board or panel is first manufactured up through and including the final etching step. As shown in FIG. 2A, a gold plating bus 18 is then routed along the laminate circuit board. The plating bus 18 includes a plurality of fingers 19 which establish an electrical connection with each of the rectangular blades 12a and 12b' to facilitate electrolytic plating of the blades. As can be seen in FIG. 2A, the contact blades initially extend to the board edge, which represents the location of the connector edge on the completed circuit board. After the contact blades and their associated traces have been plated, the plating bus 18 is removed. In addition, the blade contacts 12b' are divided by a scoring channel or scoring line, resulting in the circuit board connector edge shown in FIG. 2B. The scoring line produces electrically active blade contacts 12b which are functionally equivalent to the blades 12b shown in FIG. 1.

The method described immediately above is widely used in the industry. However, one disadvantage of this method is the need for use of scoring equipment in the process. Scoring equipment is not part of the traditional printed circuit board tool set and thus this requirement adds to the cost of fabrication of the board.

Referring now to FIGS. 3A–3B, the third prior art method is shown. FIG. 3A illustrates an intermediate processing step in the fabrication of the edge connector, and FIG. 3B illustrates the final product. As shown in FIG. 3A, the contact blades of the edge connector are constructed such that a first number of blades 12a extend to the connector edge of the board, while a second number of blades 12b are recessed a predetermined distance from the board edge. The gold or electrolytic plating bus 18 has a single finger 19 which is connected to one of the contact blades 12a, and the remaining contact blades 12a and 12b are electrically connected by means of a shorting bar 20. The shorting bar 20 includes a plurality of shunts electrically connected between the various circuit traces 13 which in turn connect to the contact blades 12a and 12b. In this manner a plating bus is formed by connecting a gold plating bus 18 to one blade and then electrically connecting or shorting the signal lines at a predetermined distance from the blade area by means of the shorting bar 20.

After the contact blades and their associated circuit traces have been plated, using techniques known in the art, the plating bus 18 is removed to form the edge connector shown in FIG. 3B. The blades are then electrically isolated, i.e., electrically disconnected from each other, by drilling holes or vias 22 in the shorting bar 20, as shown in FIG. 3B. The size of the vias drilled is generally large, typically on the order of 18 mils. However, these vias will have a smaller diameter than the length of the respective shunts which were used to connect the traces, and as a result a plurality of line stubs 24 remain after drilling the vias 22, as shown in FIG. 3B.

The third prior art method discussed above is less expensive than the first two prior art methods outlined above. However, one disadvantage of this method is that a number of large vias must be drilled in the circuit board, thus reducing the amount of area available for signal routing. In other words, the holes 22 drilled through the shorting bar 20 adjacent to the edge connector traces 13 prevents use of this area of the board for signal routing. For example, this method is unfeasible when connective vias need to be placed directly adjacent the edge of the blade for routing to inner layers or to the other side of the circuit board. Another disadvantage is that a plurality of small stubs 24 are left adjoining each edge connector trace after the holes 22 have been drilled in the shorting bar 20. These stubs 24 are unattractive in appearance and thus may adversely impact quiescent current inspection. Finally, the presence of these stubs can result in a number of potential performance problems. For example, the stubs will generally have a certain capacitance which can cause problems in applications where controlled impedance is important.

Therefore, an inexpensive method for fabricating a staggered blade edge connector for a circuit board is desired which does not require any signal routing area of the circuit board and which does not have the problems associated with capacitive stubs as in the third method described above. Such a method is provided by the present invention, which is described in greater detail hereinbelow.

SUMMARY OF THE INVENTION

The present invention provides an inexpensive method for fabricating a staggered blade edge connector for a circuit board which overcomes the difficulties of the prior art. The method of the present invention is similar in some respects to the third prior art method described above but does not require vias in the signal routing area of the circuit board and does not have the problems associated with capacitive stubs on the edge connector traces. In addition, the present invention results in better drilling accuracy over the third prior art method, because the prior art method requires drilling out the shorting bar through the soldermask. This typically results in a certain amount of drill bit deflection which occasionally causes incomplete isolation and thereby causing adjacent blades to short to each other. In addition, burrs in the drilled holes and residual slivers that could potentially cause shorts are much easier to observe during inspection when utilizing the present invention because of the absence of soldermask or other semi opaque material around the drilled hole.

The method begins with creating a plurality of staggered blades on the edge of the circuit board. A plating bus is formed on these staggered blades by first connecting a plating bus to one of the blades and then shorting together or connecting the signal lines connecting the blades via a shorting bus. The shorting bus is preferably placed flush with the innermost edge of the blades well outside of the actual wipe area of the blade connectors. The board then preferably undergoes a standard semi-additive process, as well as a final etch and subsequent electrolytic plating, preferably using gold. The plating bus is then removed and the shorting bar is drilled out as in the third prior art method described above. However, due to the placement of the shorting bar flush with the innermost edge of the blades, the vias do not occupy any precious signal routing area of the circuit board. Also, since the vias have a width approximately equal to the length of the shunts forming the shorting bar, the drilling operation does not produce any capacitive stubs. This alleviates any cosmetic or performance problems associated with these stubs while not adding any additional time or cost to the board.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 4:
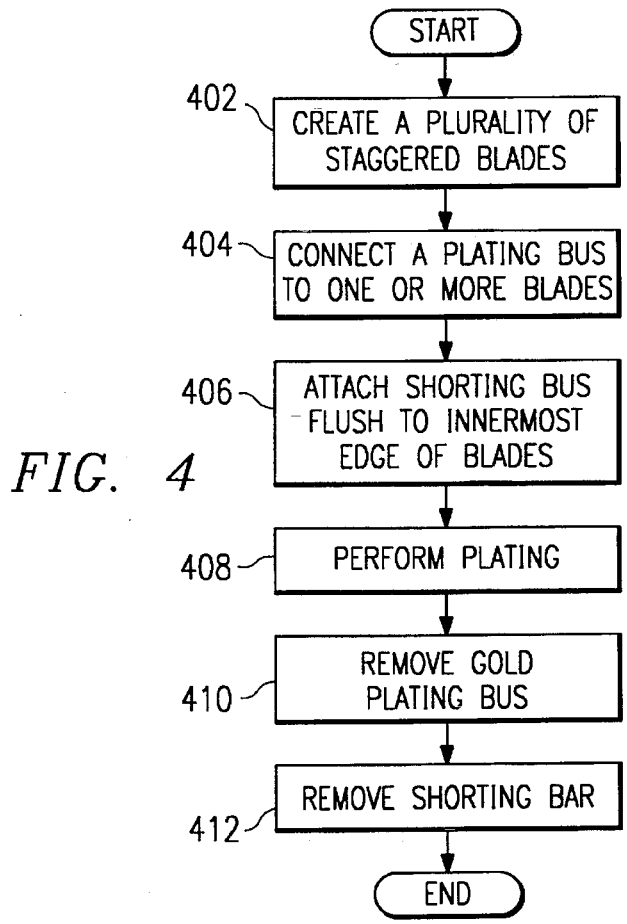
FIG. 4 is a flowchart diagram illustrating the processing steps for fabricating staggered blades on a circuit board in accordance with the method of the present invention.
Figure 5A:
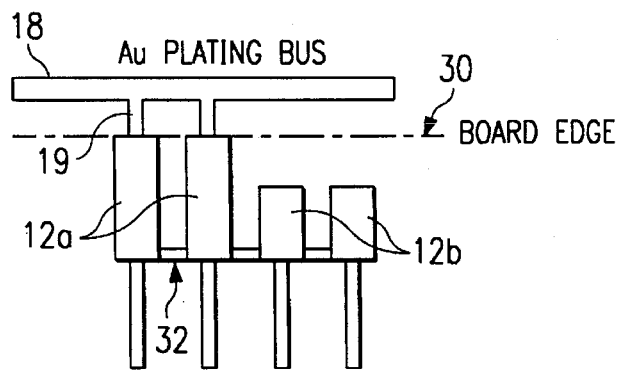
FIG. 5A illustrates an intermediate processing step in the fabrication of staggered blades on a printed circuit board using the method of the present invention.
Figure 5B:
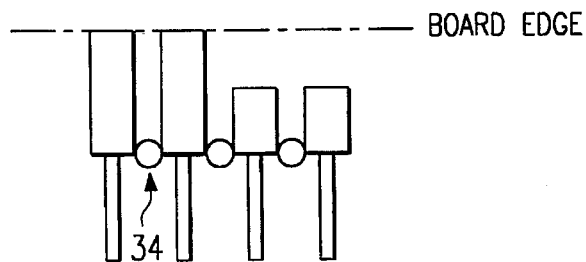
FIG. 5B illustrates a portion of a completed circuit board having staggered blades formed by the method of the present invention.

Referring now to FIG. 4, a method of fabricating a staggered blade edge connector for a printed circuit board according to the present invention is shown. The method illustrated in FIG. 4 is discussed in conjunction with FIGS. 5A and 5B for convenience. FIG. 5A illustrates a portion of a staggered blade edge connector during the fabrication process of the present invention, and FIG. 5B illustrates the final product. It is noted that the present invention may also be used on other types of edge connectors, such as non-staggered edge connectors, as desired.

Referring again to FIG. 4, in step 402 a plurality of staggered blades are created on the edge of a printed circuit board. As can be seen in FIG. 5A, for example, a first plurality of blades 12a extend to line 30, which will become the connector edge of the completed board, while a second plurality of blades 12b are recessed a predetermined distance from line 30. In this manner a plurality of blades are created having varying lengths. In the preferred embodiment the blades 12a are used for ground connections while the blades 12b are used for data and power signal connections. Also, in this example the edge connector preferably includes 40 mil blades or fingers on a 50 mil pitch. However, various blade sizes and pitch may be used, as desired.

In step 404 an electrolytic plating bus 18, preferably a gold electrolytic plating bus, is connected to the circuit board. The gold plating bus 18 includes one or more fingers 19 which connect to one or more of the blade contacts 12a or 12b. In the preferred embodiment, the gold plating bus 18 includes one finger 19 which connects to one of the blades 12a. The plating bus 17 also connects to a plating cathode (not shown), which provides electricity to the plating bus 18 during the plating process.

In step 406 a shorting bar or shorting bus 32 is electrically connected between each of the blades 12a and 12b. The shorting bar 32 comprises a plurality of shunts which electrically connect between each of the blades 12a and 12b, and in this manner the blades 12a and 12b are electrically connected together. As shown in FIG. 5A, the shorting bus 32 is preferably placed flush with the innermost edge of the blades well outside of the actual wipe area of the blade connectors. It is noted that the shorting bar 32 can be placed at various points between the blades 12a and 12b. In embodiments where holes or vias are created to remove portions of the shorting bar, the shorting bar 32 should be placed in a position outside of the actual wipe area of the blade connectors so that vias that will be subsequently drilled will not affect the contact between the blades of the edge connector and the mating socket in the computer system. If an ablation process is used to remove the shorting bar 32, then the shorting bar 32 may be able to be placed anywhere between the blades.

Due to the position of the shorting bar 32 between the blades 12a and 12b, when the shorting bar 32 is drilled out, the resultant vias are not located in the signal routing area of the circuit board. Further, the drilling operation will not produce any capacitive stubs. This alleviates cosmetic and performance problems associated with these stubs while not adding any additional time or cost to the board.

In step 408 the blades and circuit traces undergo electrolytic plating, preferably using a conductive and/or metallic substance such as gold. Other steps may also be applied to the board at this time. For example, in one embodiment, the board undergoes a standard semi-additive process, a final etch, and then gold plating. After the blade contacts and their associated circuit traces have been plated, using techniques known in the art, the plating bus 18 is removed in step 410.

In step 412 the blades are electrically isolated, i.e., electrically disconnected from each other, preferably by forming holes or vias 34 in the shorting bar 32, as shown in FIG. 5B. As shown, the holes are formed in each of the shunts comprising the shorting bar 32. The holes preferably have a diameter approximately equal to the length of each of the shunts. Thus no capacitative stubs remain after the holes have been formed. It is also noted that other methods may be used to create these holes, including drilling or punching. It is further noted that other methods such as laser ablation may be used to remove portions of the shorting bar without requiring holes in the circuit board.

Figure 1:
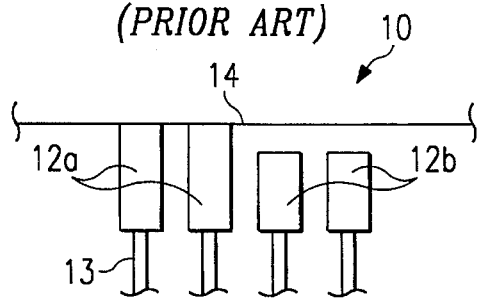
FIG. 1 illustrates a portion of a printed circuit board having a plurality of staggered connector blades along one edge thereof.
Figure 2A:
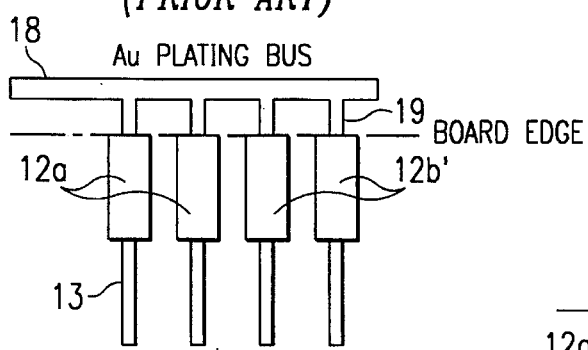
FIGS. 2A–2B illustrate a prior art method of fabricating staggered blades on a printed circuit board using an edge plating and selective scoring method.
Figure 2B:
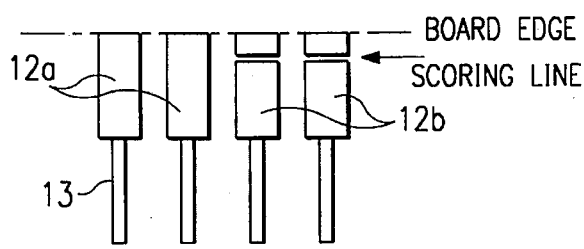
Figure 3A:
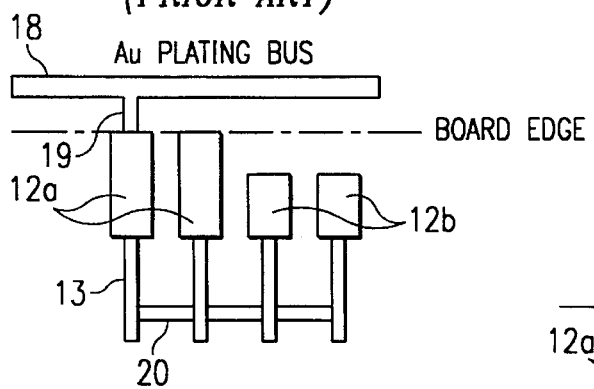
FIGS. 3A–3B illustrate a prior art method of fabricating staggered blades on a printed circuit board using a process that includes edge plating using a staggered bus followed by drilling.
Figure 3B:
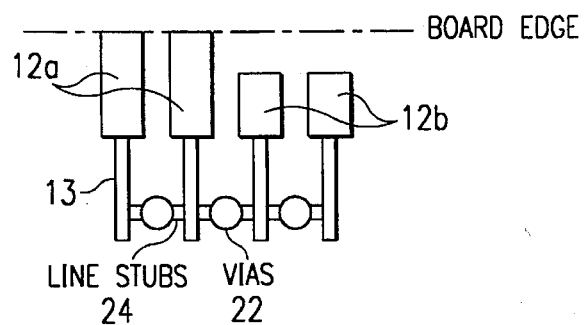

Referring again to FIG. 3, in prior art methods due to the placement of the shorting bar between the traces connecting the blades, the vias 22 are located in the signal routing area of the circuit board. This reduces the amount of area available for signal routing, which is undesirable. Also the vias created in the prior art method leave a plurality of line stubs 24. As discussed in the background section, these stubs are cosmetically unattractive and may have an associated capacitance which interferes with the operation of circuits which require carefully controlled impedances.

Referring again to FIGS. 5A and 5B, the shunts used to form the shorting bus 32 in the preferred embodiment of the present invention are placed between the blades 12a and 12b. Thus, when the holes or vias 34 are drilled in the shorting bus, the vias 34 do not occupy valuable signal routing area. Rather the area between the traces connecting the blades can now be used for signal routing or plated through holes. Also, the vias 34 have a diameter preferably approximately equal to the length of the shunts. Thus, the shunts are completely removed with no remaining line stub. Therefore the method of the present invention retains the low cost advantages of the third prior art method discussed in the background section while providing additional signal routing area and eliminating the capacitive stub problems associated with this prior art method.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A method for making an edge connector on a circuit board, comprising the steps of:

creating a plurality of blades on an edge of the circuit board, each of said blades having a first end portion for connecting to components on the circuit board and a second end portion for connecting to a mating connector socket, wherein said second end portion of at least a first one of said blades is shorter than said second end portion of at least a second one of said blades;

electrically connecting at least one of said blades to a plating cathode;

electrically interconnecting said blades via a shorting bus wherein said shorting bus is physically connected to each of said blades at said second end portion;

plating said blades with an electrically conductive substance after said steps of electrically connecting and placing; and removing portions of said shorting bus between said blades after said plating.

2. The method of claim 1, wherein said step of removing portions of said shorting bus does not leave any remaining stubs of said shorting bus.

3. The method of claim 1, wherein said step of removing portions of said shorting bus comprises forming holes in said shorting bus and said circuit board between said blades.

4. The method of claim 1, wherein said step of electrically connecting comprises connecting a plating bus to one or more of said blades prior to said step of plating; the method further comprising:

removing said plating bus after said step of plating.

5. The method of claim 1, wherein said electrically conductive substance comprises gold.

6. A method for making an edge connector on a circuit board, comprising the steps of:

creating a plurality of blades on an edge portion of the circuit board, wherein each of said blades has a first end portion which connects to components on the circuit board and a second end portion for connecting to a mating connector;

electrically connecting at least one of said blades to a plating cathode;

placing a shorting bus physically located between said blades at said second end portion thereof to electrically connect said blades;

plating said blades with an electrically conductive substance; and removing portions of said shorting bus between said blades.

7. The method of claim 6, wherein said second end portion of each of the blades comprises a wipe area for connecting with a mating connector socket; and wherein said step of placing said shorting bus comprises placing the shorting bus outside the wipe area of the blades.

8. The method of claim 6, wherein said step of removing portions of said shorting bus does not leave any remaining stubs of said shorting bus.

9. The method of claim 6, wherein said step of removing portions of said shorting bus comprises forming holes in said shorting bus and said circuit board between said blades.

10. The method of claim 6, wherein said step of electrically connecting comprises connecting a plating bus to one or more of said blades prior to said step of plating; the method further comprising the step of removing said plating bus after said step of plating.

11. The method of claim 6, wherein said electrically conductive substance comprises gold.

* * * * *